(12) United States Patent  
Onishi et al.

(10) Patent No.: US 8,384,160 B2  
(45) Date of Patent: Feb. 26, 2013

(54) SEMICONDUCTOR DEVICE AND METHOD OF MANUFACTURING SAME

(75) Inventors: Kazuhiro Onishi, Tokyo (JP); Kazuhiro Tsukamoto, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 446 days.

(21) Appl. No.: 12/627,060

(22) Filed: Nov. 30, 2009

(65) Prior Publication Data

US 2010/0164007 A1  Jul. 1, 2010

(30) Foreign Application Priority Data

Dec. 29, 2008  (JP) ................................. 2008-335656

(51) Int. Cl.  
*H01L 21/70* (2006.01)

(52) U.S. Cl. . 257/369; 257/213; 257/391; 257/E27.062; 257/E27.098; 257/E21.616; 438/199; 438/217; 438/276; 438/419; 438/527

(58) Field of Classification Search ................... 257/213, 257/369, 391, E27.062, E27.098, E21.616; 438/199, 217, 276, 419, 527  
See application file for complete search history.

(56) References Cited

U.S. PATENT DOCUMENTS

| | | | |
|---|---|---|---|
| 6,677,194 B2 * | 1/2004 | Yamanaka et al. | 438/199 |
| 7,432,548 B2 * | 10/2008 | Forbes et al. | 257/325 |
| 7,544,604 B2 * | 6/2009 | Forbes et al. | 438/622 |
| 7,563,730 B2 * | 7/2009 | Forbes et al. | 438/785 |
| 2002/0187596 A1 * | 12/2002 | Yamanaka et al. | 438/197 |
| 2008/0128822 A1 | 6/2008 | Koyama et al. | |
| 2008/0230842 A1 | 9/2008 | Oji | |

FOREIGN PATENT DOCUMENTS

| | | |
|---|---|---|
| JP | 2006-013092 | 1/2006 |
| JP | 2007-329237 | 12/2007 |

* cited by examiner

*Primary Examiner* — Telly Green  
(74) *Attorney, Agent, or Firm* — McDermott Will & Emery LLP

(57) ABSTRACT

To provide a semiconductor device and a method of manufacturing the same capable of suppressing, when a plurality of MIS transistors having different absolute values of threshold voltage is used, the reduction of the drive current of a MIS transistor having a greater absolute value of threshold voltage. The threshold voltage of a second nMIS transistor is greater than the threshold voltage of a first nMIS transistor and the sum of the concentration of lanthanum atom and the concentration of magnesium atom in a second nMIS high-k film included in the second nMIS transistor is lower than the sum of the concentration of lanthanum atom and the concentration of magnesium atom in a first nMIS high-k film included in the first nMIS transistor.

14 Claims, 8 Drawing Sheets

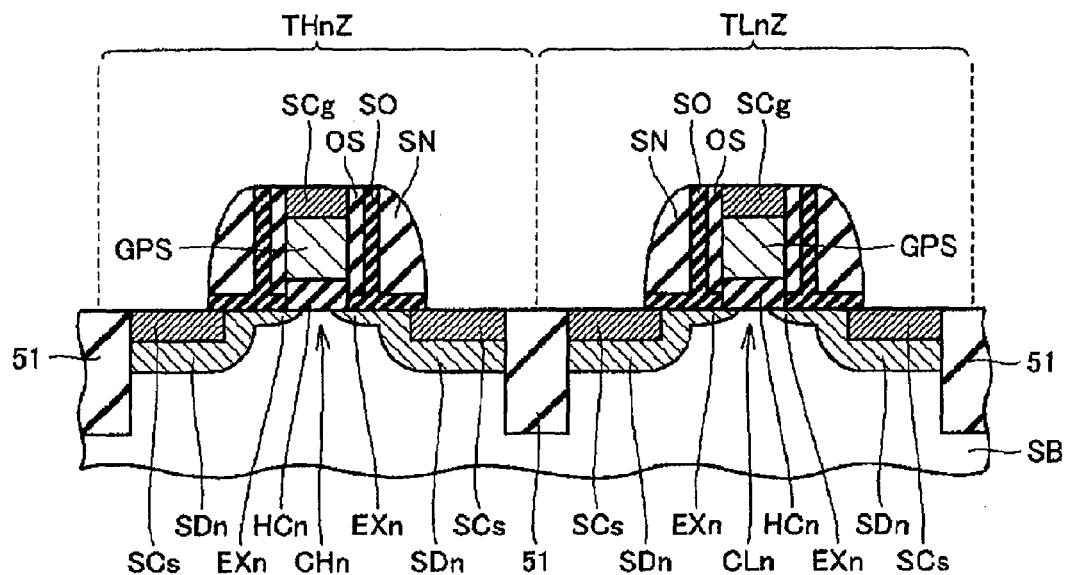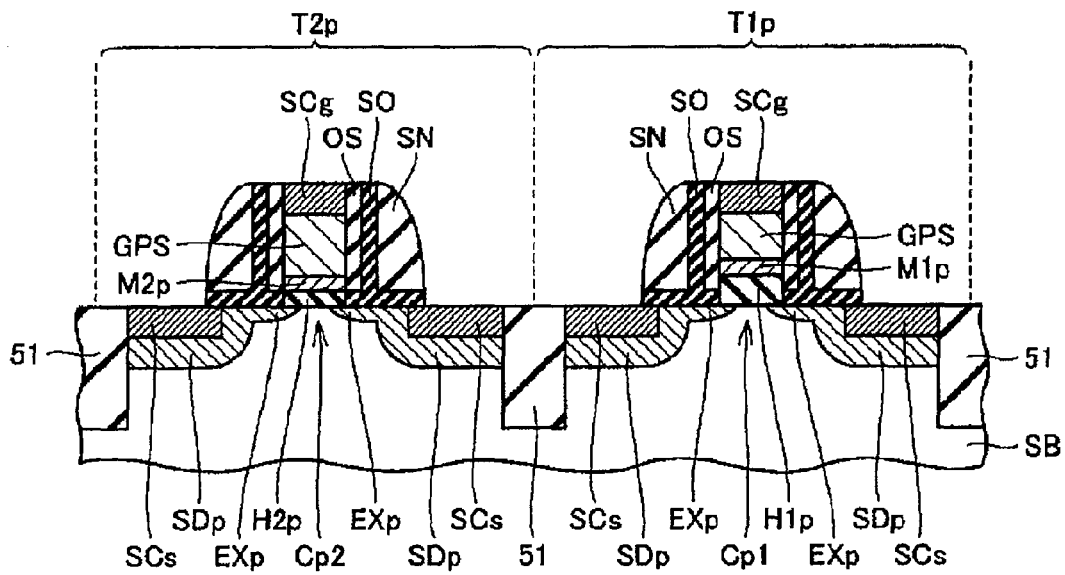

SEMICONDUCTOR DEVICE AND METHOD OF MANUFACTURING SAME

CROSS-REFERENCE TO RELATED APPLICATION

The disclosure of Japanese Patent Application No. 2008-335656 filed on Dec. 29, 2008 including the specification, drawings and abstract is incorporated herein by reference in its entirety.

BACKGROUND OF THE INVENTION

The present invention relates to a semiconductor device and a method of manufacturing the same, in particular, relates to a semiconductor device having a plurality of MIS (Metal Insulator Semiconductor) transistors with the threshold voltages different from one another, and a method of manufacturing the same.

As the film thickness of a gate insulating film is reduced in order to cope with the miniaturization of a semiconductor device, the leak current of the gate insulating film becomes a problem. In order to cope with this problem, the introduction of a high-k film as a gate insulating film material is discussed. As to the introduction, a pinning phenomenon of a threshold voltage of a MIS transistor can be a problem. In order to cope with this, according to, for example, Japanese Patent Laid-Open No. 2007-329237 (Patent Document 1), an Al-based insulating film is inserted into the interface between an Hf-based high-k film and a gate electrode.

Further, according to, for example, Japanese Patent Laid-Open No. 2006-13092 (Patent Document 2), the impurity concentration in a channel region of a MIS transistor is adjusted in order to control the threshold voltage of the MIS transistor having a high-k film.

SUMMARY OF THE INVENTION

Depending on the application of a semiconductor device, it is necessary to mixedly include over the same semiconductor substrate a plurality of MIS transistors with the absolute values of threshold voltage different from one another. In order to increase the absolute value of threshold voltage by adjusting the impurity concentration, it is necessary to increase the impurity concentration of a channel region. However, if the impurity concentration of the channel region is increased, the mobility is reduced due to the impurity scattering. Consequently, there is a problem that among the MIS transistors, the one with the greater absolute value of threshold voltage has a low drive current.

The present invention has been made in view of the above-described problems and provides a semiconductor device capable of suppressing the reduction of the drive current of a MIS transistor having a greater absolute value of threshold voltage when a plurality of MIS transistors with the absolute values of threshold voltage different from one another is used, and a method of manufacturing the same.

A semiconductor device according to an embodiment of the present invention includes a first nMIS transistor having a first nMIS threshold voltage and a second nMIS transistor having a second nMIS threshold voltage. The first nMIS transistor has a first nMIS channel region, a first nMIS high-k film, and a first nMIS metal electrode. The first nMIS channel region is provided over a semiconductor substrate. The first nMIS high-k film is provided over the first nMIS channel region, and contains at least either of lanthanum and magnesium. The first nMIS metal electrode is provided over the first nMIS high-k film. The second nMIS transistor has a second nMIS channel region, a second nMIS high-k film, and a second nMIS metal electrode. The second nMIS channel region is provided over the semiconductor substrate. The second nMIS high-k film is provided over the second nMIS channel region. The second nMIS metal electrode is provided over the second nMIS high-k film. The absolute value of the second nMIS threshold voltage is greater than the absolute value of the first nMIS threshold voltage, and the sum of the concentration of lanthanum atom and the concentration of magnesium atom in the second nMIS high-k film is lower than the sum of the concentration of lanthanum atom and the concentration of magnesium atom in the first nMIS high-k film.

A semiconductor device according to another embodiment of the present invention includes a first pMIS transistor having a first pMIS threshold voltage and a second pMIS transistor having a second pMIS threshold voltage. The first pMIS transistor has a first pMIS channel region, a first pMIS high-k film, and a first pMIS metal electrode. The first pMIS channel region is provided over a semiconductor substrate. The first pMIS high-k film is provided over the first pMIS channel region and contains aluminum. The first pMIS metal electrode is provided over the first pMIS high-k film. The second pMIS transistor has a second pMIS channel region, a second pMIS high-k film, and a second pMIS metal electrode. The second pMIS channel region is provided over the semiconductor substrate. The second pMIS high-k film is provided over the second pMIS channel region. The second pMIS metal electrode is provided over the second pMIS high-k film. The absolute value of the second pMIS threshold voltage is greater than the absolute value of the first pMIS threshold voltage, and the concentration of aluminum atom in the second pMIS high-k film is lower than the concentration of aluminum atom in the first pMIS high-k film.

A method of manufacturing a semiconductor device according to an embodiment of the present invention has the following steps. A first and a second nMIS channel region having a p-type conductive type are formed by injecting p-type impurities onto a semiconductor substrate. A high-k film is formed over the first and second nMIS channel regions. An nMIS cap film containing at least either of lanthanum and magnesium is formed so as to cover the part over the first nMIS channel region of the high-k film and to expose the part over the second nMIS channel region of the high-k film. A first nMIS metal electrode is formed over the first nMIS channel region via the high-k film and the nMIS cap film and a second nMIS metal electrode is formed over the second nMIS channel region via the high-k film. At least either of lanthanum and magnesium contained in the nMIS cap film is diffused into the part over the first nMIS channel region of the high-k film.

A method of manufacturing a semiconductor device according to another embodiment of the present invention has the following steps. A first and a second pMIS channel region having an n-type conductive type are formed by injecting n-type impurities onto a semiconductor substrate.

A high-k film is formed over the first and second pMIS channel regions. A pMIS cap film containing aluminum is formed so as to cover the part over the first pMIS channel region of the high-k film and to expose the part over the second pMIS channel region of the high-k film. A first pMIS metal electrode is formed over the first pMIS channel region via the high-k film and the pMIS cap film and a second pMIS metal electrode is formed over the second pMIS channel region via the high-k film.

Aluminum contained in the pMIS cap film is diffused into the part over the first pMIS channel region of the high-k film.

According to a semiconductor device and a method of manufacturing the same in an embodiment of the present invention, the sum of the concentration of lanthanum atom and the concentration of magnesium atom in the second nMIS high-k film is lower than the sum of the concentration of lanthanum atom and the concentration of magnesium atom in the first nMIS high-k film. Consequently, it is possible to increase the absolute value of threshold voltage of the second nMIS transistor having the second nMIS high-k film compared to the absolute value of threshold voltage of the first nMIS transistor having the first nMIS high-k film without the need to increase the impurity concentration of the channel region. Consequently, it is possible to suppress the reduction of the drive current of the second nMIS transistor while increasing the absolute value of threshold voltage of the second nMIS transistor compared to the absolute value of threshold voltage of the first nMIS transistor.

According to a semiconductor device and a method of manufacturing the same in another embodiment of the present invention, the concentration of aluminum atom in the second pMIS high-k film is lower than the concentration of aluminum atom in the first pMIS high-k film. Consequently, it is possible to increase the absolute value of threshold voltage of the second pMIS transistor having the second pMIS high-k film compared to the absolute value of threshold voltage of the first pMIS transistor having the first pMIS high-k film without the need to increase the impurity concentration of the channel region. Consequently, it is possible to suppress the reduction of the drive current of the second pMIS transistor while increasing the absolute value of threshold voltage of the second pMIS transistor compared to the absolute value of threshold voltage of the first pMIS transistor.

BRIEF DESCRIPTION OF THE DRAWINGS

FIG. 6 is a partial section view schematically showing a configuration of a semiconductor device in a comparative example for the first embodiment of the present invention;

FIG. 7 is a partial section view schematically showing a configuration of a semiconductor device in a second embodiment of the present invention;

DETAILED DESCRIPTION OF THE PREFERRED EMBODIMENTS

Embodiments of the present invention will be described below based on the drawings.

(First Embodiment)

Figure 1:
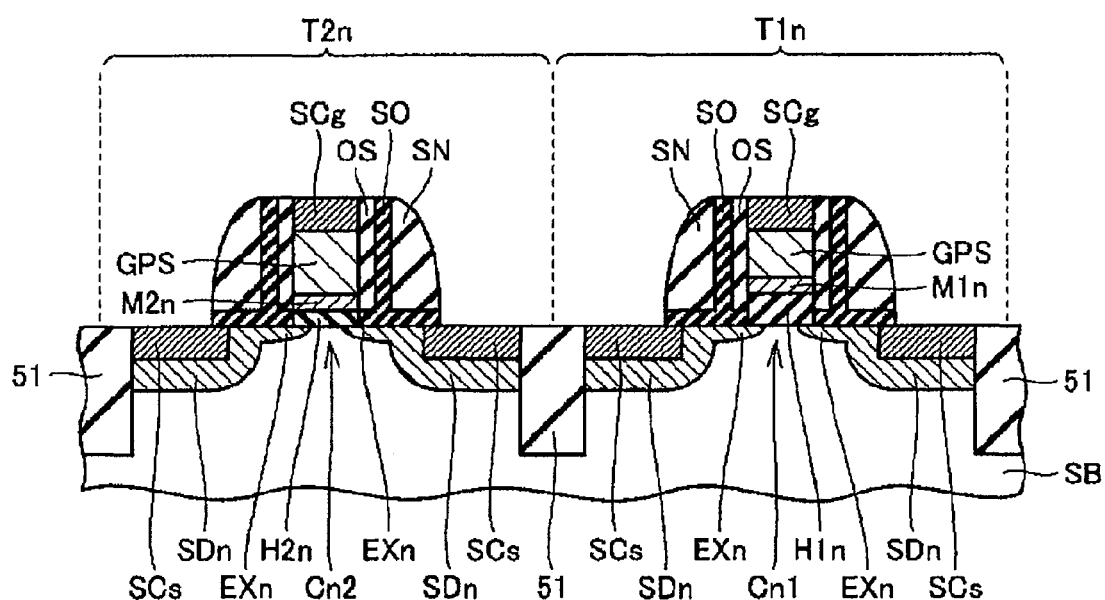
FIG. 1 is a partial section view schematically showing a configuration of a semiconductor device in a first embodiment of the present invention.

FIG. 1 is a partial section view schematically showing a configuration of a semiconductor device in a first embodiment of the present invention.

Referring to FIG. 1, a semiconductor device $100n$ in the present embodiment has a first nMIS transistor $T1n$ and a second nMIS transistor $T2n$. The first and second nMIS transistors $T1n$, $T2n$ are separated from each other by a silicon oxide film 51 configured to separate elements over a semiconductor substrate SB. The first and second nMIS transistors $T1n$, $T2n$ have a first and a second nMIS threshold voltage, respectively. The absolute value of the second nMIS threshold voltage is greater than that of the first nMIS threshold voltage.

The first nMIS transistor $T1n$ has a first nMIS channel region Cn1, a first nMIS high-k film $H1n$, a first nMIS metal electrode $M1n$, a gate polysilicon layer GPS, a pair of n-type source/drain regions SDn, an n-type source/drain extension EXn, nickel silicide layers SCg, SCs, an offset spacer OS, a silicon oxide film SO, and a silicon nitride film SN.

The second nMIS transistor $T2n$ has a second nMIS channel region Cn2, a second nMIS high-k film $H2n$, a second nMIS metal electrode Mtn, the gate polysilicon layer GPS, a pair of the n-type source/drain regions SDn, the n-type source/drain extension EXn, the nickel silicide layers SCg, SCs, the offset spacer OS, the silicon oxide film SO, and the silicon nitride film SN.

The first and second nMIS channel regions Cn1, Cn2 are a region to which p-type impurities have been added in order to form an n-channel and provided over the semiconductor substrate SB. Preferably, the respective impurity concentrations of the first and second n-channel regions Cn1, Cn2 are the same.

The first and second nMIS high-k films $H1n$, $H2n$ are an Hf-based insulating film provided respectively over the first and second nMIS channel regions Cn1, Cn2. The Hf-based insulating film contains, for example, $HfO_2$ or HfSiON as its principal component. The first nMIS high-k film $H1n$ contains at least either of lanthanum or magnesium. The sum of the concentration of lanthanum atom and the concentration of magnesium atom in the second nMIS high-k film $H2n$ is lower than the sum of the concentration of lanthanum atom and the concentration of magnesium atom in the first nMIS high-k film $H1n$. Preferably, the second nMIS high-k film $H2n$ contains neither lanthanum nor magnesium.

The first and second nMIS metal electrodes M1n, M2n are provided over the first and second nMIS high-k films H1n, H2n, respectively. Preferably, the first and second nMIS metal electrodes M1n, M2n are made of one material, for example, TiN (titanium nitride).

Next, a manufacturing method of the semiconductor device 100n will be described. FIG. 2 to FIG. 5 are each a partial section view schematically showing first to fourth steps of a method of manufacturing a semiconductor device in the first embodiment of the present invention.

Figure 2:
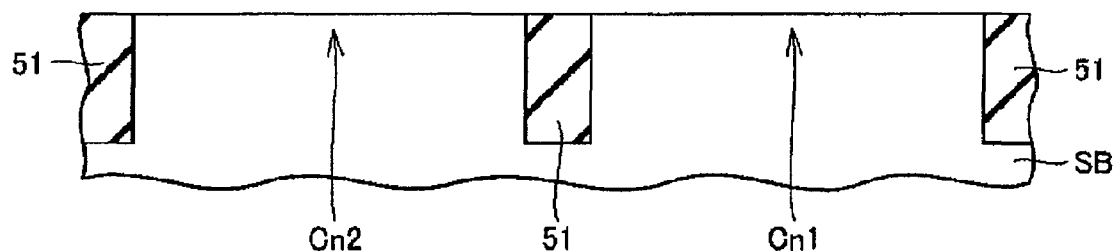
FIG. 2 is a partial section view schematically showing a first step of a method of manufacturing the semiconductor device in the first embodiment of the present invention.

Referring to FIG. 2, by injecting p-type impurities onto the semiconductor substrate SB, the first and second nMIS channel regions Cn1, Cn2 having a p-type conductive type are formed. Preferably, the first and second nMIS channel regions Cn1, Cn2 are formed simultaneously. When the first and second nMIS channel regions Cn1, Cn2 are formed simultaneously in this manner, the respective impurity concentrations of the first and second nMIS channel regions Cn1, Cn2 are the same, as a result.

Figure 3:
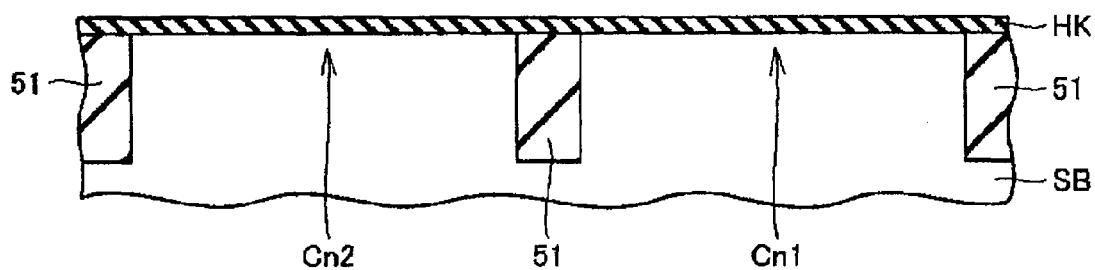
FIG. 3 is a partial section view schematically showing a second step of the method of manufacturing the semiconductor device in the first embodiment of the present invention.

Referring to FIG. 3, a high-k film HK is formed over the first and second nMIS channel regions Cn1, Cn2. The high-k film HK is an Hf-based insulating film having a dielectric constant higher than that of a silicon oxide film.

Figure 4:
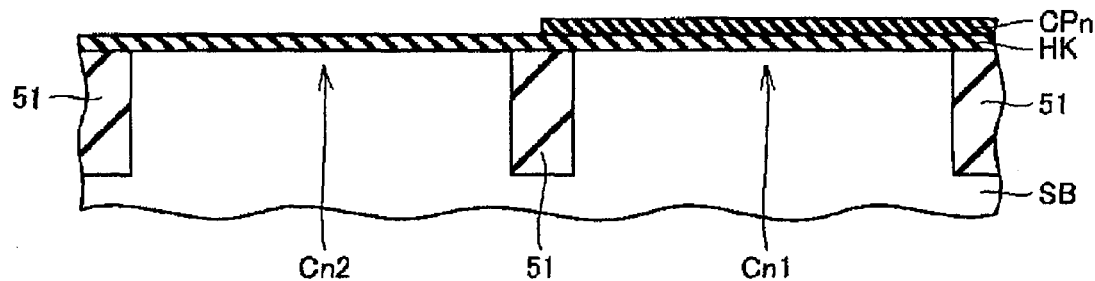
FIG. 4 is a partial section view schematically showing a third step of the method of manufacturing the semiconductor device in the first embodiment of the present invention.

Referring to FIG. 4, an nMIS cap film CPn is formed so as to cover the part over the first nMIS channel region Cn1 of the high-k film HK and to expose the part over the second nMIS channel region Cn2 of the high-k film HK. The nMIS cap film CPn is a film containing at least either of lanthanum and magnesium, for example, a lanthanum oxide film or a magnesium oxide film. Next, a metal layer and a polysilicon layer are deposited in order. The metal layer is deposited so as to come into contact with the nMIS cap film CPn and the high-k film HK over the first and second nMIS channel regions Cn1, Cn2, respectively. The material of the metal layer is, for example, TiN.

Figure 5:
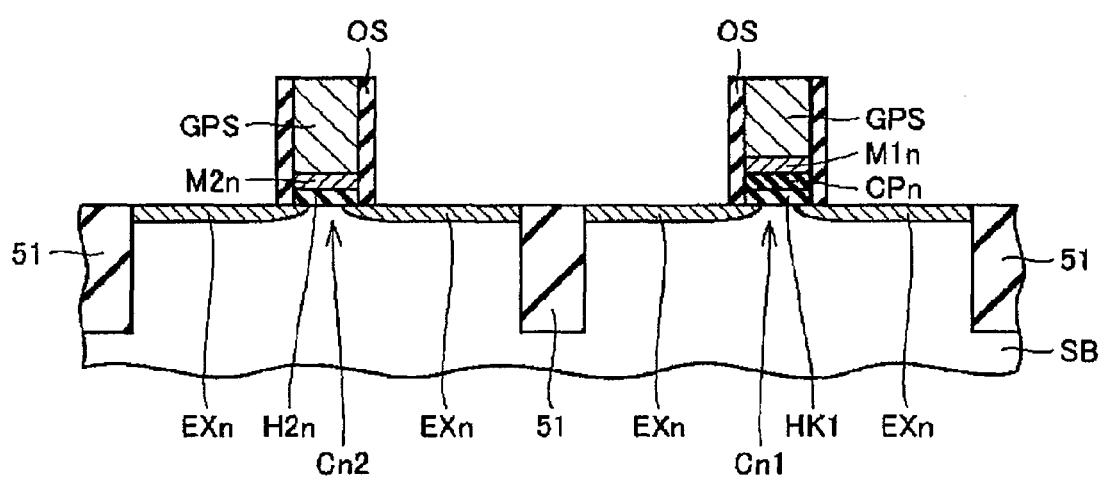
FIG. 5 is a partial section view schematically showing a fourth step of the method of manufacturing the semiconductor device in the first embodiment of the present invention.

Referring to FIG. 5, the patterning of the polysilicon layer and the metal layer, the nMIS cap film CPn, and the high-k film HK is performed.

With the arrangement, over the first nMIS channel region Cn1, a lamination of a high-k film HK1 formed by patterning the high-k film HK, the nMIS cap film CPn, the first nMIS metal electrode M1n formed by patterning the above-mentioned metal layer, and the gate polysilicon layer GPS formed by patterning the above-mentioned polysilicon layer is formed. At the same time, over the second nMIS channel region Cn2, a lamination of the second nMIS high-k film H2n formed by patterning the high-k film HK, the second nMIS metal electrode M2n formed by patterning the above-mentioned metal layer, and the gate polysilicon layer GPS formed by patterning the above-mentioned polysilicon layer is formed.

Next, the n-type source/drain extension EXn and the offset spacer OS are formed.

Referring to FIG. 1 again, the silicon oxide film SO and the silicon nitride film SN are formed. Next, the n-type source/drain region SDn is formed. Next, the nickel silicide layers SCg, SCs are formed. By the thermal processing accompanying the formation of the nickel silicide layers SCg, SCs or separate thermal processing, the nMIS cap film CPn (FIG. 5) is diffused into the high-k film HK1, and thereby, the first nMIS high-k film H1n is formed. That is, at least either of lanthanum and magnesium contained in the nMIS cap film CPn is diffused into the part over the first nMIS channel region Cn1 of the high-k film HK1 (FIG. 5), that is, the high-k film HK (FIG. 4).

From the above, the semiconductor device 100n in the present embodiment is manufactured. FIG. 6 is a partial section view schematically showing a configuration of a semiconductor device in a comparative example for the first embodiment of the present invention. Referring to FIG. 6, in a semiconductor device 100nZ in the comparative example, each of nMIS transistors TLnZ and THnZ has a high-k film HCn. In order to make the threshold voltage of the nMIS transistor THnZ greater than that of the nMIS transistor TLnZ, the impurity concentration of a channel region CHn of the nMIS transistor THnZ is set higher than that of a channel region CLn of the nMIS transistor TLnZ. Because of this, in the channel region CHn, the mobility is reduced due to an increase in the impurity scattering. Consequently, the drive current of the nMIS transistor THnZ is reduced.

According to the present embodiment, into the first nMIS high-k film H1n, at least either of lanthanum atom and magnesium atom is diffused from the nMIS cap film CPn. As a result of this, the work function of the first nMIS metal electrode M1n in the first nMIS transistor T1n is reduced. Specifically, the work function is reduced from about 4.50 eV, which is a value in a state where the above diffusion is not present, so as to come close to 4.05 eV. As a result of this, the absolute value of threshold voltage of the first nMIS transistor T1n is reduced.

On the other hand, unlike the first nMIS high-k film H1n, neither lanthanum atom nor magnesium atom is diffused into the second nMIS high-k film H2n. Consequently, the sum of the concentration of lanthanum atom and the concentration of magnesium atom in the second nMIS high-k film H2n is lower than the sum of the concentration of lanthanum atom and the concentration of magnesium atom in the first nMIS high-k film H1n. As a result of this, the work function of the second nMIS metal electrode M2n becomes greater compared to the first nMIS metal electrode M1n. Consequently, the absolute value of threshold voltage of the second nMIS transistor T2n becomes greater than the absolute value of threshold voltage of the first nMIS transistor T1n.

That is, it is possible to increase the absolute value of threshold voltage of the second nMIS transistor T2n without the need to increase the channel concentration of the second nMIS channel region Cn2. Consequently, it is possible to increase the absolute value of threshold voltage of the second nMIS transistor T2n while avoiding the reduction of the mobility accompanying an increase in the impurity scattering. Consequently, it is possible to suppress the reduction of the drive current of the second nMIS transistor T2n while increasing the absolute value of threshold voltage of the second nMIS transistor T2n compared to the absolute value of threshold voltage of the first nMIS transistor T1n.

Further, according to the present embodiment, it is possible to simultaneously form the first and second nMIS channel regions Cn1, Cn2 while making the respective threshold voltages of the first and second nMIS transistors T1n, T2n differ from each other. Consequently, it is possible to simplify the formation step of the first and second nMIS channel regions Cn1, Cn2.

(Second Embodiment)

FIG. 7 is a partial section view schematically showing a configuration of a semiconductor device in a second embodiment of the present invention.

Referring to FIG. 7, a semiconductor device 100p in the present embodiment has a first pMIS transistor T1p and a second pMIS transistor T2p. The first and second pMIS transistors T1p, T2p are separated from each other by the silicon oxide film 51 configured to separate elements over the semiconductor substrate SB. The first and second pMIS transistors T1p, T2p have a first and a second pMIS threshold voltage, respectively. The absolute value of the second pMIS threshold voltage is greater than that of the first pMIS threshold voltage.

The first pMIS transistor T1p has a first pMIS channel region Cp1, a first pMIS high-k film H1p, a first pMIS metal electrode M1p, the gate polysilicon layer GPS, a pair of p-type source/drain regions SDp, a p-type source/drain extension EXp, the nickel silicide layers SCg, SCs, the offset spacer OS, the silicon oxide film SO, and the silicon nitride film SN.

The second pMIS transistor T2p has a second pMIS channel region Cp2, a second pMIS high-k film H2p, a second pMIS metal electrode M2p, the gate polysilicon layer GPS, a pair of the p-type source/drain regions SDp, the p-type source/drain extension EXp, the nickel silicide layers SCg, SCs, the offset spacer OS, the silicon oxide film SO, and the silicon nitride film SN.

The first and second pMIS channel regions Cp1, Cp2 are a region to which n-type impurities have been added in order to form a p-channel and provided over the semiconductor substrate SB. Preferably, the respective impurity concentrations of the first and second p-channel regions Cp1, Cp2 are the same.

The first and second pMIS high-k films H1p, H2p are an Hf-based insulating film provided respectively over the first and second pMIS channel regions Cp1, Cp2. The first pMIS high-k film H1p contains aluminum. The concentration of aluminum atom in the second pMIS high-k film H2p is lower than the concentration of aluminum atom in the first pMIS high-k film H1p. Preferably, the second pMIS high-k film H2p does not contain aluminum.

The first and second pMIS metal electrodes M1p, M2p are provided over the first and second pMIS high-k films H1p, H2p, respectively. Preferably, the first and second pMIS metal electrodes M1p, M2p are made of one material, for example, TiN (titanium nitride).

Next, a manufacturing method of the semiconductor device 100p will be described. FIG. 8 to FIG. 11 are each a partial section view schematically showing first to fourth steps of a method of manufacturing a semiconductor device in the second embodiment of the present invention.

Figure 8:
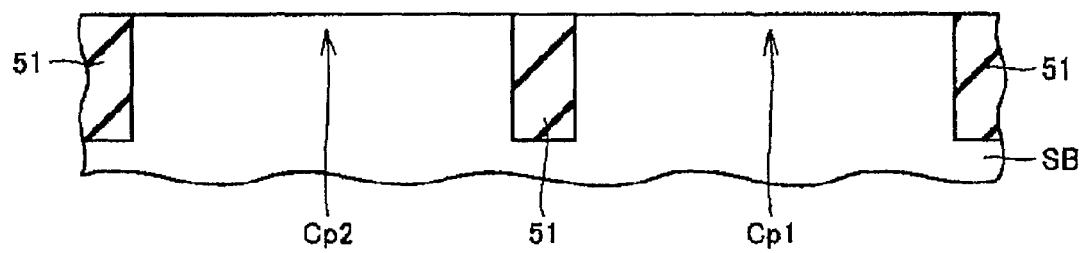
FIG. 8 is a partial section view schematically showing a first step of a method of manufacturing the semiconductor device in the second embodiment of the present invention.

Referring to FIG. 8, by injecting n-type impurities onto the semiconductor substrate SB, the first and second pMIS channel regions Cp1, Cp2 having an n-type conductive type are formed. Preferably, the first and second pMIS channel regions Cp1, Cp2 are formed simultaneously. When the first and second pMIS channel regions Cp1, Cp2 are formed simultaneously in this manner, the respective impurity concentrations of the first and second p-channel regions Cp1, Cp2 are the same, as a result.

Figure 9:
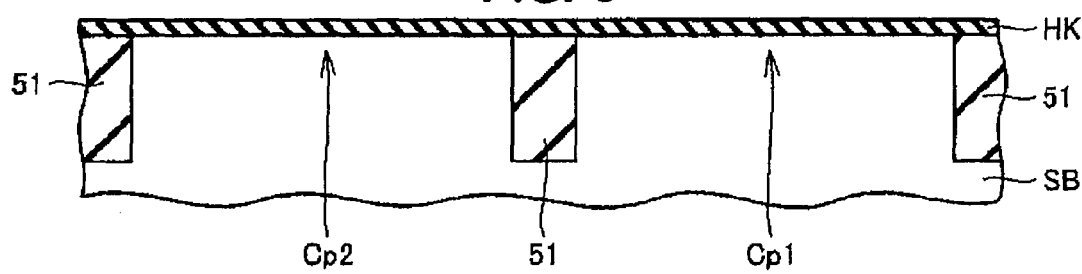
FIG. 9 is a partial section view schematically showing a second step of the method of manufacturing the semiconductor device in the second embodiment of the present invention.

Referring to FIG. 9, the high-k film HK is formed over the first and second pMIS channel regions Cp1, Cp2. The high-k film HK is an Hf-based insulating film having a dielectric constant higher than that of a silicon oxide film.

Figure 10:
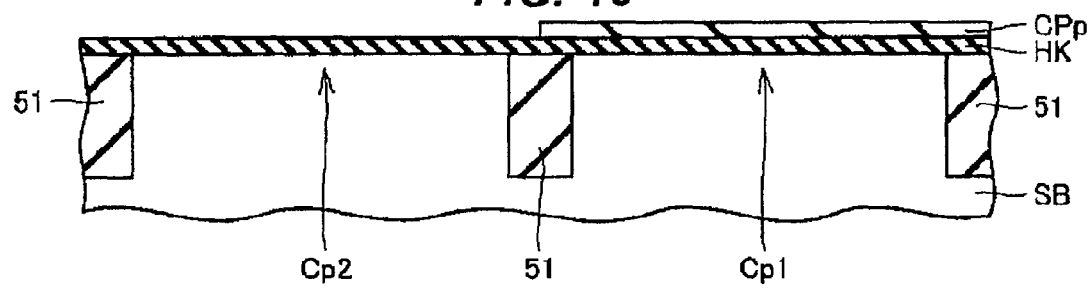
FIG. 10 is a partial section view schematically showing a third step of the method of manufacturing the semiconductor device in the second embodiment of the present invention.

Referring to FIG. 10, a pMIS cap film CPp is formed so as to cover the part over the first pMIS channel region Cp1 of the high-k film HK and to expose the part over the second pMIS channel region Cp2 of the high-k film HK. The pMIS cap film CPp is a film containing aluminum, for example, an aluminum oxide film. Next, a metal layer and a polysilicon layer are deposited in order. The metal layer is deposited so as to come into contact with the pMIS cap film CPp and the high-k film HK over the first and second pMIS channel regions Cp1, Cp2, respectively. The material of the metal layer is, for example, TiN.

Figure 11:
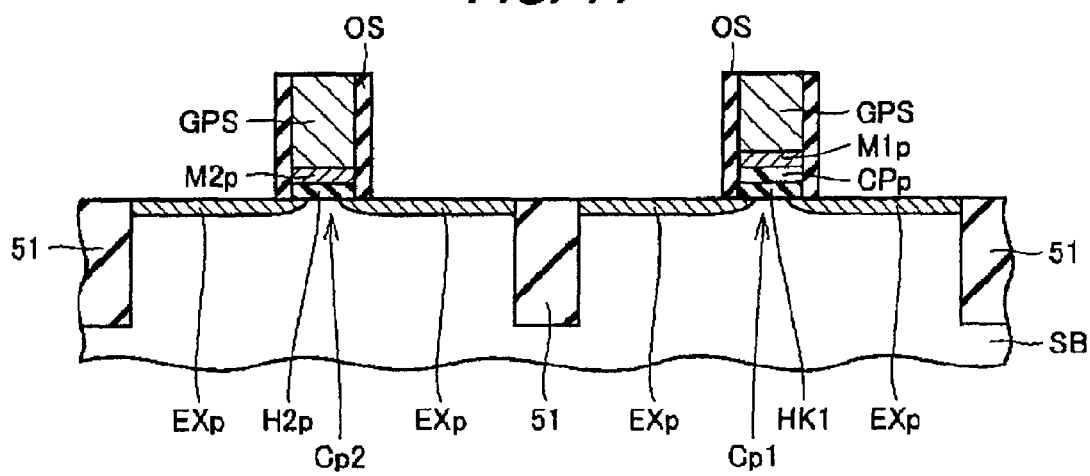
FIG. 11 is a partial section view schematically showing a fourth step of the method of manufacturing the semiconductor device in the second embodiment of the present invention.

Referring to FIG. 11, the patterning of the polysilicon layer and the metal layer, the pMIS cap film CPp, and the high-k film HK is performed.

With the arrangement, over the first pMIS channel region Cp1, a lamination of the high-k film HK1 formed by patterning the high-k film HK, the pMIS cap film CPp, the first pMIS metal electrode M1p formed by patterning the above-mentioned metal layer, and the gate polysilicon layer GPS formed by patterning the above-mentioned polysilicon layer is formed. At the same time, over the second pMIS channel region Cp1, a lamination of the second pMIS high-k film H2p formed by patterning the high-k film HK, the second pMIS metal electrode M2p formed by patterning the above-mentioned metal layer, and the gate polysilicon layer GPS formed by patterning the above-mentioned polysilicon layer is formed.

Next, the p-type source/drain extension EXp and the offset spacer OS are formed.

Referring to FIG. 7 again, the silicon oxide film SO and the silicon nitride film SN are formed. Next, the p-type source/drain region SDp is formed. Next, the nickel silicide layers SCg, SCs are formed. By the thermal processing accompanying the formation of the nickel silicide layers SCg, SCs or separate thermal processing, the pMIS cap film CPp (FIG. 11) is diffused into the high-k film HK1, and thereby, the first pMIS high-k film H1p is formed. That is, aluminum contained in the pMIS cap film CPp is diffused into the part over the first pMIS channel region Cp1 of the high-k film HK1 (FIG. 11), that is, the high-k film HK (FIG. 10).

From the above, the semiconductor device 100p in the present embodiment is manufactured. Configurations other than those described above are substantially the same as those in the above-described first embodiment, and therefore, the same symbols are assigned to the same or corresponding elements and their description is not repeated.

According to the present embodiment, into the first pMIS high-k film H1p, the aluminum atoms are diffused from the pMIS cap film CPp. As a result of this, the work function of the first pMIS metal electrode M1p in the first pMIS transistor T1p is increased. Specifically, the work function is increased from about 4.50 eV, which is a value in a state where the above diffusion is not present, so as to come close to 5.17 eV. As a result of this, the absolute value of threshold voltage of the first pMIS transistor T1p is reduced.

On the other hand, unlike the first pMIS high-k film H1p, the aluminum atoms are not diffused into the second pMIS high-k film H2p. Consequently, the concentration of aluminum atom in the second pMIS high-k film H2p is lower than that of aluminum atom in the first pMIS high-k film H1p. As a result of this, the work function of the second pMIS metal electrode M2p becomes less compared to the first pMIS metal electrode M1p. Consequently, the absolute value of threshold voltage of the second pMIS transistor T2p becomes greater than that of threshold voltage of the first pMIS transistor T1p.

That is, it is possible to increase the absolute value of threshold voltage of the second pMIS transistor T2p without the need to increase the channel concentration of the second pMIS channel region Cp2. Consequently, it is possible to increase the absolute value of threshold voltage of the second pMIS transistor T2p while avoiding the reduction of the mobility accompanying an increase in the impurity scattering. Consequently, it is possible to suppress the reduction of the drive current of the second pMIS transistor T2p while increasing the absolute value of threshold voltage of the second pMIS transistor T2p compared to the absolute value of the threshold voltage of the first pMIS transistor T1p.

Further, according to the present embodiment, it is possible to simultaneously form the first and second pMIS channel regions Cp1, Cp2 while making the respective threshold voltages of the first and second pMIS transistors T1p, T2p differ from each other. Consequently, it is possible to simplify the formation step of the first and second pMIS channel regions Cp1, Cp2.

(Third Embodiment)

Figure 12:
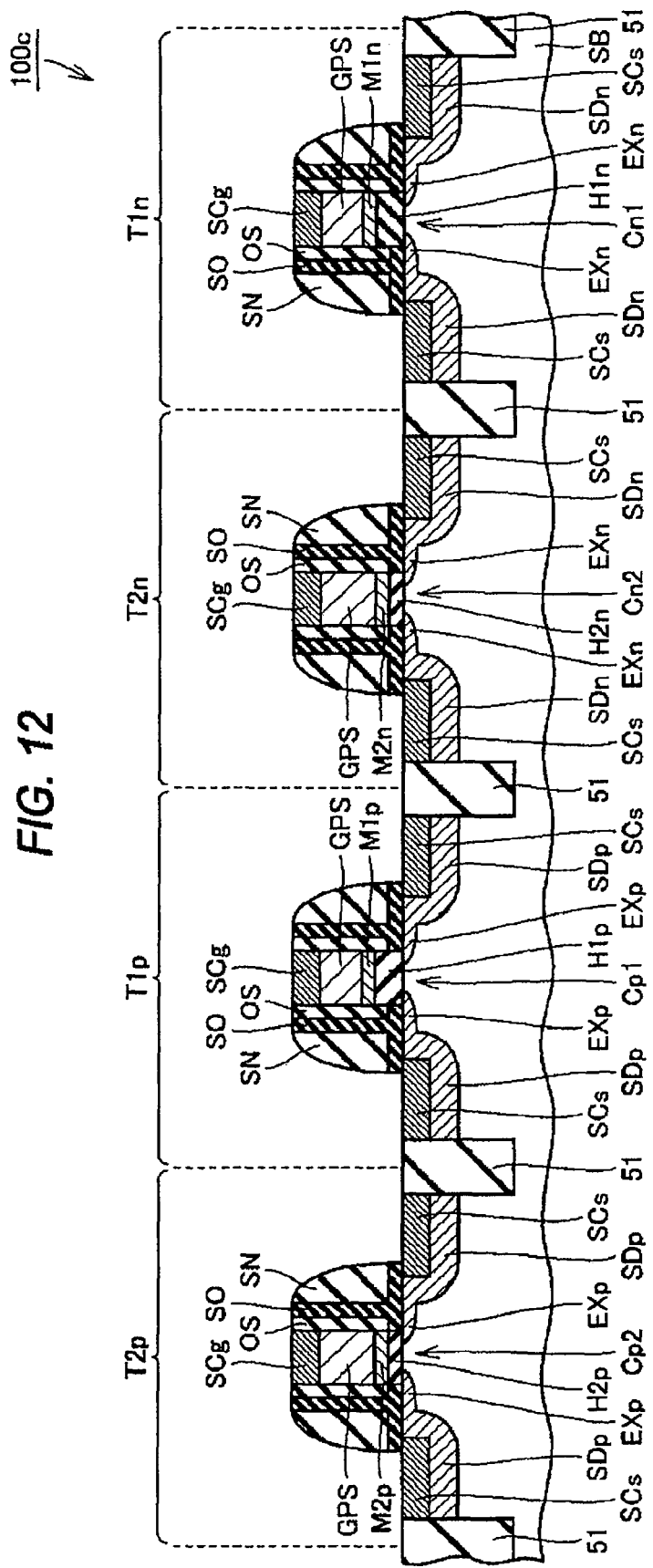
FIG. 12 is a partial section view schematically showing a configuration of a semiconductor device in a third embodiment of the present invention.

FIG. 12 is a partial section view schematically showing a configuration of a semiconductor device in a third embodiment of the present invention. Referring to FIG. 12, a semiconductor device 100c in the present embodiment further has the first and second nMIS transistors T1n, T2n in addition to the configuration of the semiconductor device 100p in the second embodiment.

Configurations other than those described above are substantially the same as those in the above-described first or second embodiment, and therefore, the same symbols are assigned to the same or corresponding elements and their description is not repeated.

According to the present embodiment, the same effects as those in the first and second embodiments, respectively, can be obtained. Further, it is possible to form a CMIS structure having both the nMIS structure and the pMIS structure.

(Fourth Embodiment)

Figure 13:
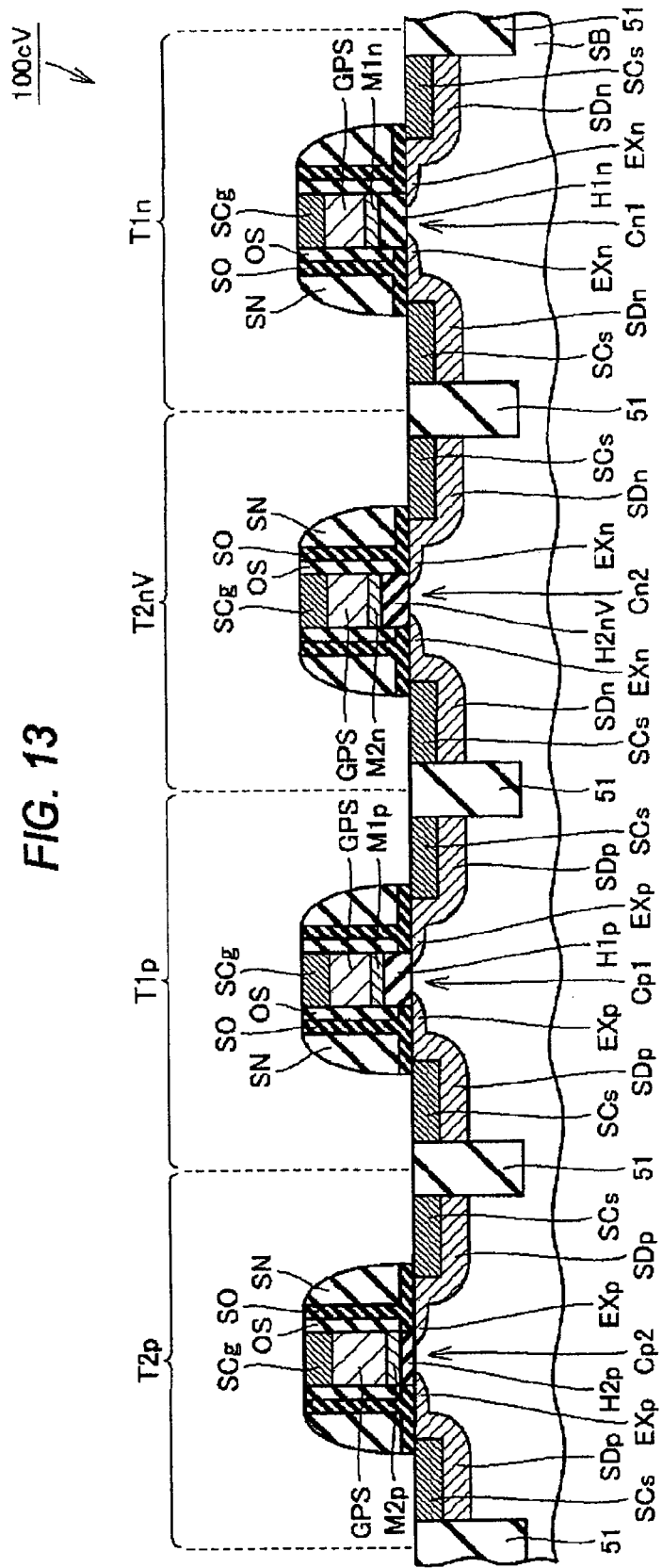
FIG. 13 is a partial section view schematically showing a configuration of a semiconductor device in a fourth embodiment of the present invention.

FIG. 13 is a partial section view schematically showing a configuration of a semiconductor device in a fourth embodiment of the present invention. Referring to FIG. 13, a semiconductor device 100cV in the present embodiment further has the first nMIS transistor T1n in the first embodiment and a second nMIS transistor T2nV in addition to the configuration of the semiconductor device 100p in the second embodiment. The second nMIS transistor T2nV has the same configuration as that of the first nMIS transistor T1n in the first embodiment.

Configurations other than those described above are substantially the same as those in the above-described first or second embodiment, and therefore, the same symbols are assigned to the same or corresponding elements and their description is not repeated.

According to the present embodiment, the same effects as those in the second embodiment can be obtained. Further, it is possible to form a CMIS structure having both the nMIS structure and the pMIS structure. Unlike the third embodiment, the step of forming the nMIS cap film CPn (FIG. 4) is not necessary.

(Fifth Embodiment)

Figure 14:
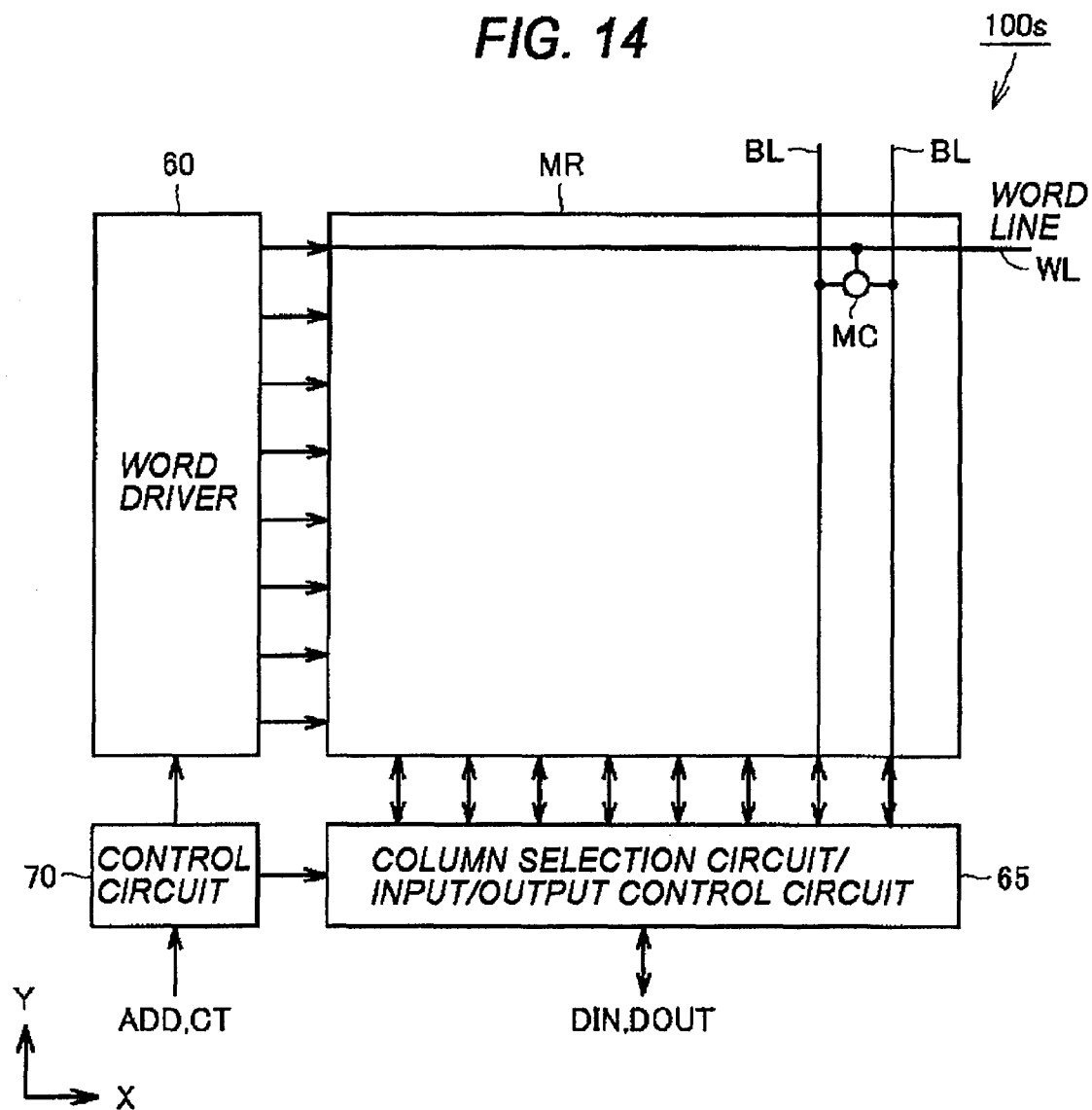
FIG. 14 is a block diagram schematically showing a configuration of a semiconductor storage device as a semiconductor device in a fifth embodiment of the present invention.

FIG. 14 is a block diagram schematically showing a configuration of a semiconductor storage device as a semiconductor device in a fifth embodiment of the present invention.

Referring to FIG. 14, an SRAM (Static Random Access Memory) device 100s, which is a semiconductor storage device as a semiconductor device in the present embodiment, has a memory array MR and a peripheral circuit part. The peripheral circuit part has a control circuit 70, a word driver 60, and a column selection circuit/input and output control circuit 65.

The memory array MR has a plurality of memory cells MC (cell part) integrally arranged in the form of a matrix, a plurality of word lines WL along the row direction (X direction), and a plurality of bit lines BL along the column direction (Y direction). The memory cell MC is a unit structure for storing information.

The control circuit 70 controls the entire SRAM device 100s based on the input of an address ADD and a control signal CT, and issues a necessary instruction to or controls the word driver 60 and the column selection circuit/input and output control circuit 65. The word driver 60 accesses the memory cell MC in a selected row by driving the word line WL. The column selection circuit/input and output control circuit 65 performs the column selection of the memory array MR in response to the instruction from the control circuit 70, performs the column selection operation of the bit line BL, and performs data write by driving the bit line BL to a predetermined logic level based on input data DIN, for example, at the time of data write. At the time of data read, the column selection circuit/input and output control circuit 65 generates and outputs output data DOUT held by the memory cell MC selected based on the read current that flows through the memory cell MC selected via the bit line BL.

Figure 15:
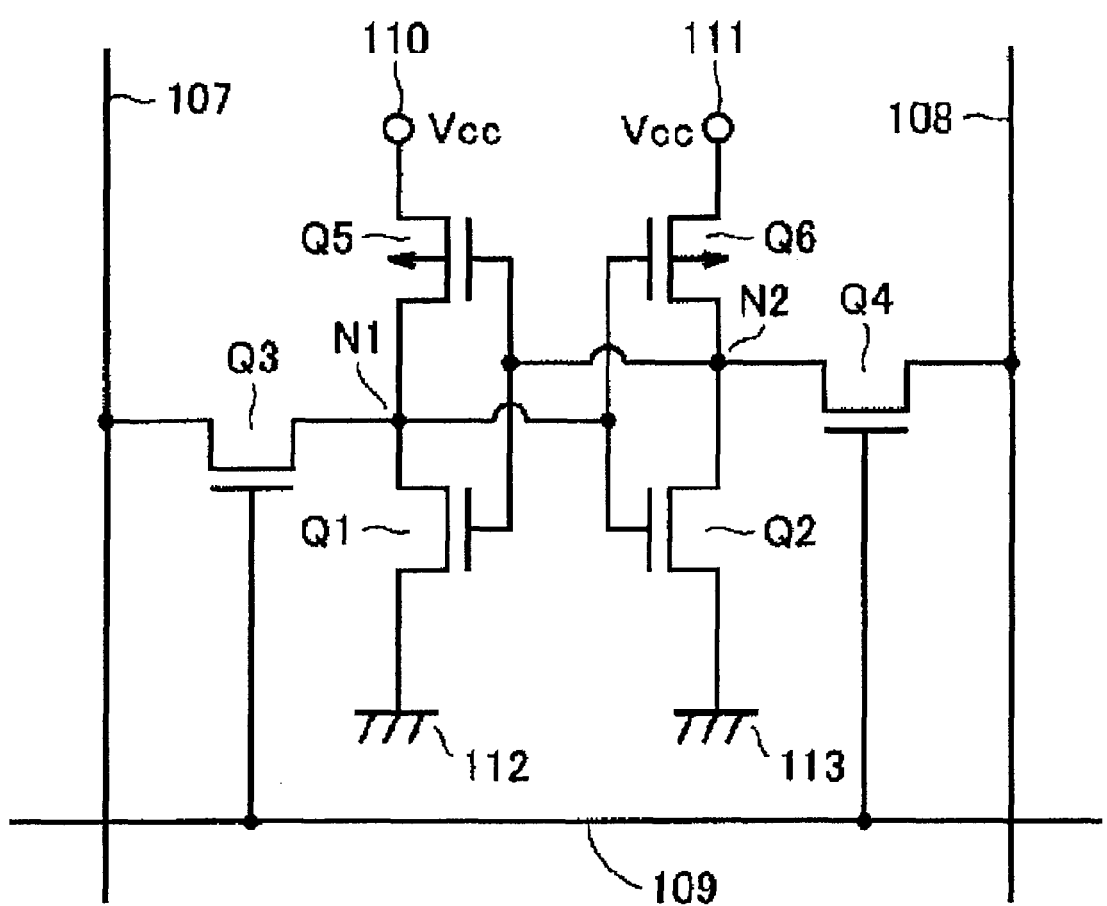
FIG. 15 is an equivalent circuit diagram schematically showing a configuration of a memory cell in the semiconductor storage device in FIG. 14.

FIG. 15 is an equivalent circuit diagram schematically showing a configuration of a memory cell in the semiconductor storage device in FIG. 14.

Referring to FIG. 15, a certain memory cell MC is disposed at the intersection of complementary data lines 107, 108 included in the bit lines BL (FIG. 14) and a word line 109 included in the word lines WL (FIG. 14). The memory cell MC includes a flip-flop circuit including a pair of inverter circuits and a pair of access transistors Q3, Q4.

The flip-flop circuit constitutes two cross-coupled storage nodes N1, N2. The storage nodes N1, N2 have a bi-stable state where one is at High and the other is at Low. It is possible to continue to maintain the bi-stable state by continuing to apply a predetermined power supply voltage to the memory cell MC.

Each of the pair of the access transistors Q3, Q4 is a MOS transistor. One of the source/drain regions of the access transistor Q3 is coupled to the storage node N1 and the other of the source/drain regions is coupled to the bit line 107. One of the source/drain regions of the access transistor Q4 is coupled to the storage node N2 and the other of the source/drain regions is coupled to the bit line 108. Each gate of the access transistors Q3, Q4 is coupled to the word line 109. Consequently, it is possible for the word line 109 to control the conduction and non-conduction states of the access transistors Q3, Q4.

The inverter circuit includes one driver transistor Q1 (or Q2) and one load transistor Q5 (or Q6). Each of a pair of the driver transistors Q1, Q2 is a MOS transistor. Each of the source regions of the pair of the driver transistors Q1, Q2 is coupled to each of GNDs (ground potentials) 112 and 113. The drain region of the driver transistor Q1 is coupled to the storage node N1 and the drain region of the driver transistor Q2 is coupled to the storage node N2. Further, the gate of the driver transistor Q1 is coupled to the storage node N2 and the gate of the driver transistor Q2 is coupled to the storage node N1.

Each of the load transistors Q5, Q6 is a MOS transistor. The source regions of the load transistors Q5, Q6 are coupled to Vcc power supplies 110, 111, respectively. The drain regions of the load transistors Q5, Q6 are coupled to the storage nodes N1, N2, respectively. The gate of the load transistor Q5 is coupled to the gate of the driver transistor Q1 and the drain region of the driver transistor Q2. The gate of the load transistor Q6 is coupled to the gate of the driver transistor Q2 and the drain region of the driver transistor Q1.

As described above, the flip-flop circuit is formed by cross-coupling a pair of the inverter circuits.

When data is written to the memory cell MC, the word line 109 is selected to bring the access transistors Q3, Q4 into conduction and a voltage is applied forcedly to the bit line pair 107, 108 in accordance with a desired logic value, and thus, the bi-stable state of the flip-flop circuit is set to either state. When data is read from the memory cell MC, the access transistors Q3, Q4 are brought into conduction, and thereby, the potentials of the storage nodes N1, N2 are transmitted to the bit lines 107, 108.

Each of the transistors Q1 to Q6 has the same configuration as that of the second nMIS transistor T2n or the second pMIS transistor T2p described in the first and second embodiments. The transistor included in the peripheral circuit part (part other than the memory array MR in FIG. 14) includes at least either of the first nMIS transistor T1n and the first pMIS transistor T1p described in the first and second embodiments.

According to the present embodiment, it is possible to increase the operation speed of a semiconductor storage device by suppressing the absolute value of threshold voltage of the peripheral circuit part while keeping the absolute value of threshold voltage of the transistors Q1 to Q6 at a value sufficiently large for the operation of the memory array MR.

In the memory array MR region, for which miniaturization is demanded in particular, it is not necessary to separately manufacture the first and second nMIS transistors T1n, T2n and it is also not necessary to separately manufacture the first and second pMIS transistors T1p, T2p. It is, therefore, possible to obtain the above-mentioned effects while suppressing the reduction in the degree of integration of a semiconductor storage device caused by the separate manufacture of these elements.

It should be considered that the embodiments disclosed as above are only examples in all points and they are not limitative. The scope of the present invention is defined not by the above descriptions but by claims and it is intended that all modifications in the meaning and scope equivalent to claims are included.

The present invention can be applied advantageously, in particular, to a semiconductor device having a plurality of MIS transistors with different threshold voltages, and a method of manufacturing the same.

What is claimed is:

1. A semiconductor device comprising:
    a first nMIS transistor having a first nMIS threshold voltage; and
    a second nMIS transistor having a second nMIS threshold voltage,
    wherein the first nMIS transistor includes:
        a first nMIS channel region provided over a semiconductor substrate;
        a first nMIS high-k film provided over the first nMIS channel region and containing at least either of lanthanum and magnesium; and
        a first nMIS metal electrode provided over the first nMIS high-k film,
    wherein the second nMIS transistor includes:
        a second nMIS channel region provided over a semiconductor substrate;
        a second nMIS high-k film provided over the second nMIS channel region; and
        a second nMIS metal electrode provided over the second nMIS high-k film,
    wherein the absolute value of the second nMIS threshold voltage is greater than the absolute value of the first nMIS threshold voltage, and
    wherein the sum of the concentration of lanthanum atom and the concentration of magnesium atom in the second nMIS high-k film is lower than the sum of the concentration of lanthanum atom and the concentration of magnesium atom in the first nMIS high-k film.

2. The semiconductor device according to claim 1, wherein the first and second nMIS high-k films are an Hf-based insulating film.

3. The semiconductor device according to claim 1 or 2, wherein the second nMIS high-k film contains neither lanthanum nor magnesium.

4. The semiconductor device according to claim 1, wherein the first and second nMIS metal electrodes are made of one material.

5. The semiconductor device according to claim 1, wherein the impurity concentration of each of the first and second nMIS channel regions is the same.

6. The semiconductor device according to claim 1,
    wherein the semiconductor device is an SRAM device having a plurality of cell parts for storing information and a peripheral circuit part that is electrically coupled with each of the cell parts for reading/writing information from/to the cell parts,
    wherein the peripheral circuit part includes the first nMIS transistor, and
    wherein the cell part includes the second nMIS transistor.

7. A semiconductor device comprising:
    a first pMIS transistor having a first pMIS threshold voltage; and
    a second pMIS transistor having a second pMIS threshold voltage,
    wherein the first pMIS transistor includes:
        a first pMIS channel region provided over a semiconductor substrate;
        a first pMIS high-k film provided over the first pMIS channel region and containing aluminum; and
        a first pMIS metal electrode provided over the first pMIS high-k film,
    wherein the second pMIS transistor includes:
        a second pMIS channel region provided over a semiconductor substrate;
        a second pMIS high-k film provided over the second pMIS channel region; and
        a second pMIS metal electrode provided over the second pMIS high-k film,
    wherein the absolute value of the second pMIS threshold voltage is greater than the absolute value of the first pMIS threshold voltage, and
    wherein the concentration of aluminum atom in the second pMIS high-k film is lower than the concentration of aluminum atom in the first pMIS high-k film.

8. The semiconductor device according to claim 7, wherein the first and second pMIS high-k films are an Hf-based insulating film.

9. The semiconductor device according to claim 7 or 8, wherein the second pMIS high-k film does not contain aluminum.

10. The semiconductor device according to any of claim 7, wherein the first and second pMIS metal electrodes are made of one material.

11. The semiconductor device according to claim 7, wherein the impurity concentration of each of the first and second pMIS channel regions is the same.

12. The semiconductor device according to claim 7,
    wherein the semiconductor device is an SRAM device having a plurality of cell parts for storing information and a peripheral circuit that is electrically coupled with each of the cell parts for reading/writing information from/to the cell parts,
    wherein the peripheral circuit part includes the first pMIS transistor, and
    wherein the cell part includes the second pMIS transistor.

13. The semiconductor device according to claim 7, further comprising:
- a first nMIS transistor having a first nMIS threshold voltage; and
- a second nMIS transistor having a second nMIS threshold voltage, wherein the first nMIS transistor includes:
- a first nMIS channel region provided over a semiconductor substrate;
- a first nMIS high-k film provided over the first nMIS channel region and containing at least either of lanthanum and magnesium; and
- a first nMIS metal electrode provided over the first nMIS high-k film, wherein the second nMIS transistor includes:
- a second nMIS channel region provided over a semiconductor substrate;
- a second nMIS high-k film provided over the second nMIS channel region; and
- a second nMIS metal electrode provided over the second nMIS high-k film, wherein the absolute value of the second nMIS threshold voltage is greater than the absolute value of the first nMIS threshold voltage, and wherein the sum of the concentration of lanthanum atom and the concentration of magnesium atom in the second nMIS high-k film is lower than the sum of the concentration of lanthanum atom and the concentration of magnesium atom in the first nMIS high-k film.

14. The semiconductor device according to claim 7, further comprising:
- a first nMIS transistor having a first nMIS threshold voltage; and
- a second nMIS transistor having a second nMIS threshold voltage, wherein the first nMIS transistor includes:
- a first nMIS channel region provided over a semiconductor substrate;
- a first nMIS high-k film provided over the first nMIS channel region and containing at least either of lanthanum and magnesium; and
- a first nMIS metal electrode provided over the first nMIS high-k film, wherein the second nMIS transistor includes:
- a second nMIS channel region provided over a semiconductor substrate;
- a second nMIS high-k film provided over the second nMIS channel region and containing at least either of lanthanum and magnesium; and
- a second nMIS metal electrode provided over the second nMIS high-k film, and wherein the absolute value of the second nMIS threshold voltage is greater than the absolute value of the first nMIS threshold voltage.

* * * * *